United States Patent [19]

Bergemont

[11] Patent Number: 5,086,410
[45] Date of Patent: Feb. 4, 1992

[54] NON-ERASABLE EPROM CELL FOR REDUNDANCY CIRCUIT

[75] Inventor: Albert M. Bergemont, San Jose, Calif.

[73] Assignee: National Semiconductor Corporation, Santa Clara, Calif.

[21] Appl. No.: 582,528

[22] Filed: Sep. 14, 1990

[51] Int. Cl.⁵ ............................................. G11C 13/00
[52] U.S. Cl. .................................... 365/53; 365/200; 365/51
[58] Field of Search ........................... 365/200, 51, 53

[56] References Cited

U.S. PATENT DOCUMENTS 4,933,898  6/1990  Gilberg et al. .......................... 365/53
4,958,320  9/1990  Homma et al. ......................... 365/53

Primary Examiner—Terrell W. Fears
Attorney, Agent, or Firm—Flehr, Hohbach, Test, Albritton & Herbert

[57] ABSTRACT

A semiconductor electrically programmable read only memory (EPROM) contains an array of memory cells that store data which is erased when the EPROM is exposed to radiation, and also contains redundant memory circuitry. The redundant memory circuit includes one or more rows or columns of redundant memory cells. A programmable redundancy control circuit determines, for each row or column of redundant memory cells, which row or column of defective memory cells it will be used to replace. The programmable redundancy control circuit has a plurality of non-erasable EPROM cells. Distinct metal connection lines, formed from a first metal layer, are coupled to the drain region of each non-erasable EPROM cell for detecting the data stored therein. A metal shield, formed from a second metal layer, overlies the non-erasable EPROM cells and the metal connection lines. Further, vertical metal walls coupled to the metal shield at least partially block radiation from entry under the metal shield. The metal shield and vertical metal walls enable the non-erasable EPROM cells in the programmable redundancy control circuit to be permanently programmed so that each row or column of redundant memory cells can be assigned a permanent address.

6 Claims, 5 Drawing Sheets

NON-ERASABLE EPROM CELL FOR REDUNDANCY CIRCUIT

The present invention relates generally to electrically programmable read only memory (EPROM) devices, and particularly to special shielded electrically programmable memory cells which are not erasable through exposure of the memory device to ultraviolet light.

BACKGROUND OF THE INVENTION

Many semiconductor memory devices contain one or more redundant rows or columns of memory cells. During initial testing of each memory chip the test routine looks for device failures. If the number of rows or columns in the memory chip containing device failures is less than or equal to the number of redundant rows or columns, then the redundant rows or columns are "programmed" so as to replace the columns containing defective cells.

FIG. 1 shows a block diagram of a memory device with a redundant memory circuit. An array 100 of memory cells is shown here as a set of columns 102, including at least one defective column 104. In other words, there is a column 104 of memory cells which contains at least one defective element, which may be a defective cell, a broken or high resistance bit line, a defective sense amplifier, etc. Also shown is a simplified diagram of the column decoder circuitry 106 which selects a column 102 in accordance with address signals AO through An.

A redundancy usage control circuit 108 includes a number of programmable circuit elements 110. The redundancy usage control circuit 108 produces a high signal on its output line 112 when selecting redundant column 114. The programmable circuit elements 110 would be programmed in such a manner that when defective column 104 is selected by the address signals, the output 112 of the redundancy control circuit 108 will be high. Consequently, redundant column 114 will be selected. When the output of the redundancy control circuit 108 is high, the output of invertor 116 will be low. The output of this invertor 116 is connected to the input of all the AND gates 118 that are used to decode the column address signals. Thus the output of each AND gate 118 in decoder 106 will be low when the redundancy control circuit 108 selects the redundant column 114. Hence, when defective column 104 is addressed, the decoder 106 is disabled to prevent access to defective column 104, and the redundant column 114 is selected instead.

One method of performing the programming of the cells 110 in the redundancy control circuit 108 is to employ fusible silicon links (see, for example, U.S. Pat. No. 3,792,319). Another technique used to program redundant rows or columns is called laser programming, in which a set of metal line connections can be selectively removed by a laser so as to program the redundancy circuit. Both of these techniques have problems which make them undesirable, although laser programming is widely used.

The present invention specifically concerns redundancy circuits for EPROM memory devices, and particularly the use of non-erasable EPROM cells as the programmable circuit elements 110 in the redundancy control circuit 108 of FIG. 1. The seminal patents in this area of semiconductor memory technology are U.S. Pat. Nos. 4,358,833, 4,441,170, 4,519,050 and 4,530,074, all of which are assigned to Intel Corporation of Santa Clara, California. U.S. Pat. Nos. 4,358,833, 4,441,170, 4,519,050 and 4,530,074 (herein called the Intel patents) are hereby incorporated by reference.

The basic idea behind the non-erasable EPROM cells in the aforementioned prior art patents is shielding a set of otherwise standard EPROM cells to form the programmable circuit elements 110 of a redundancy control circuit 108, thereby preventing the shielded cells from being erased when the memory device is exposed to ultraviolet radiation for a prolonged period of time so as to erase the data stored in all the regular EPROM memory cells in the array 100. In this way, the shielded EPROM memory cells 110 in the redundancy control circuit 108 can be fabricated on the same substrate as electrically programmable EPROM cells which are erased when exposed to ultraviolet radiation.

The shielded EPROM cells used in the Intel patents are vulnerable to light which scatters and reflects under the shielding. Therefore the shielding in the Intel patents is designed to make the path for propagating light under the shielding very long so as to cause most of this reflected light to be absorbed and otherwise dissipated before reaching the shielded cells. More particularly, a set of long serpentine drain connections are used to reduce the effect of light reflected under the shield on the shielded EPROM cells. As a result, Intel's shielded EPROM cells consume a very large amount of semiconductor surface area. A typical set of four shielded memory cells will occupy approximately 10,000 square microns using 1.0 micron design rules.

The object of the present invention is to provide shielded EPROM memory cells for use in a redundancy control circuit which occupy significantly less area than those disclosed in the Intel patents, thereby making the use of such shielded cells less expensive and more commercially viable. Another object of the present invention is to provide a shield for EPROM cells which effectively blocks radiation from reaching the shielded cells without using a set of serpentine drain connections.

SUMMARY OF THE INVENTION

In summary, the present invention provides a set of non-erasable electrically programmable read only memory (EPROM) cells for use in the redundancy control circuitry of an EPROM device. The EPROM memory device contains an array of memory cells that store data which is erased when the EPROM is exposed to radiation. A redundant memory circuit in the EPROM memory device includes one or more rows or columns of redundant memory cells.

A programmable redundancy control circuit determines, for each row or column of redundant memory cells, which row or column of defective memory cells it will be used to replace. The programmable redundancy control circuit has a plurality of non-erasable EPROM cells. Distinct metal connection lines, formed from a first metal layer, are coupled to the drain region of each non-erasable EPROM cell for detecting the data stored therein.

A metal shield, formed from a second metal layer, is coupled to the common source of each non-erasable EPROM cell and overlies the non-erasable EPROM cells and the metal connection lines. Further, vertical metal walls coupled to the metal shield at least partially block radiation from entry under the metal shield. The metal shield and vertical metal walls enable the non-erasable EPROM cells in the programmable redundancy control circuit to be permanently programmed so that each row or column of redundant memory cells can be assigned a permanent address.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
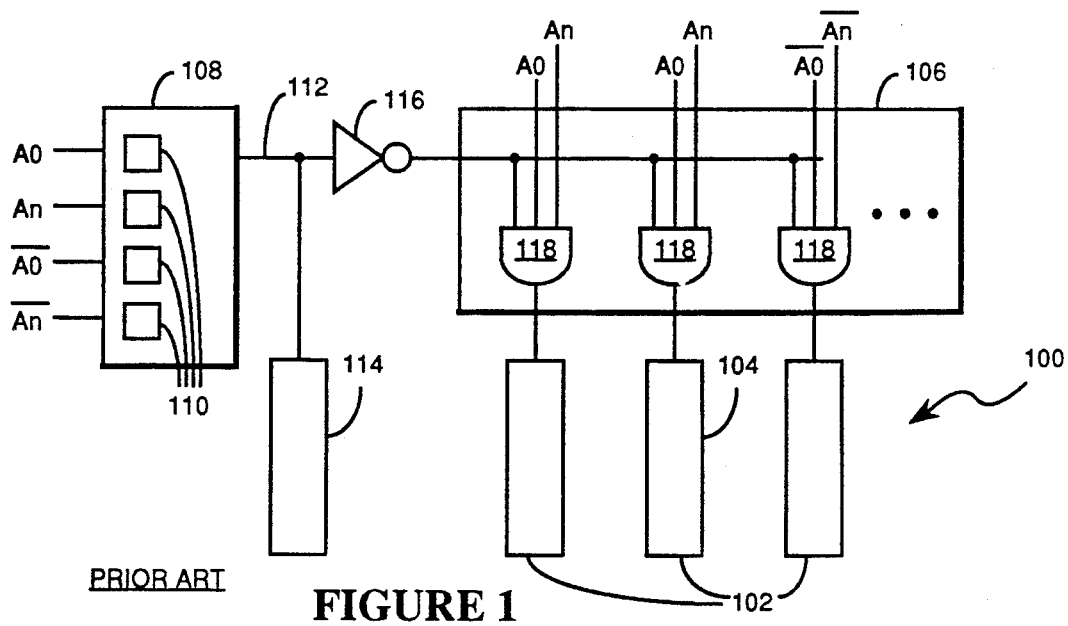
FIG. 1 is a block diagram of a memory array with a redundant column of memory cells and a redundancy control circuit.
Figure 2:
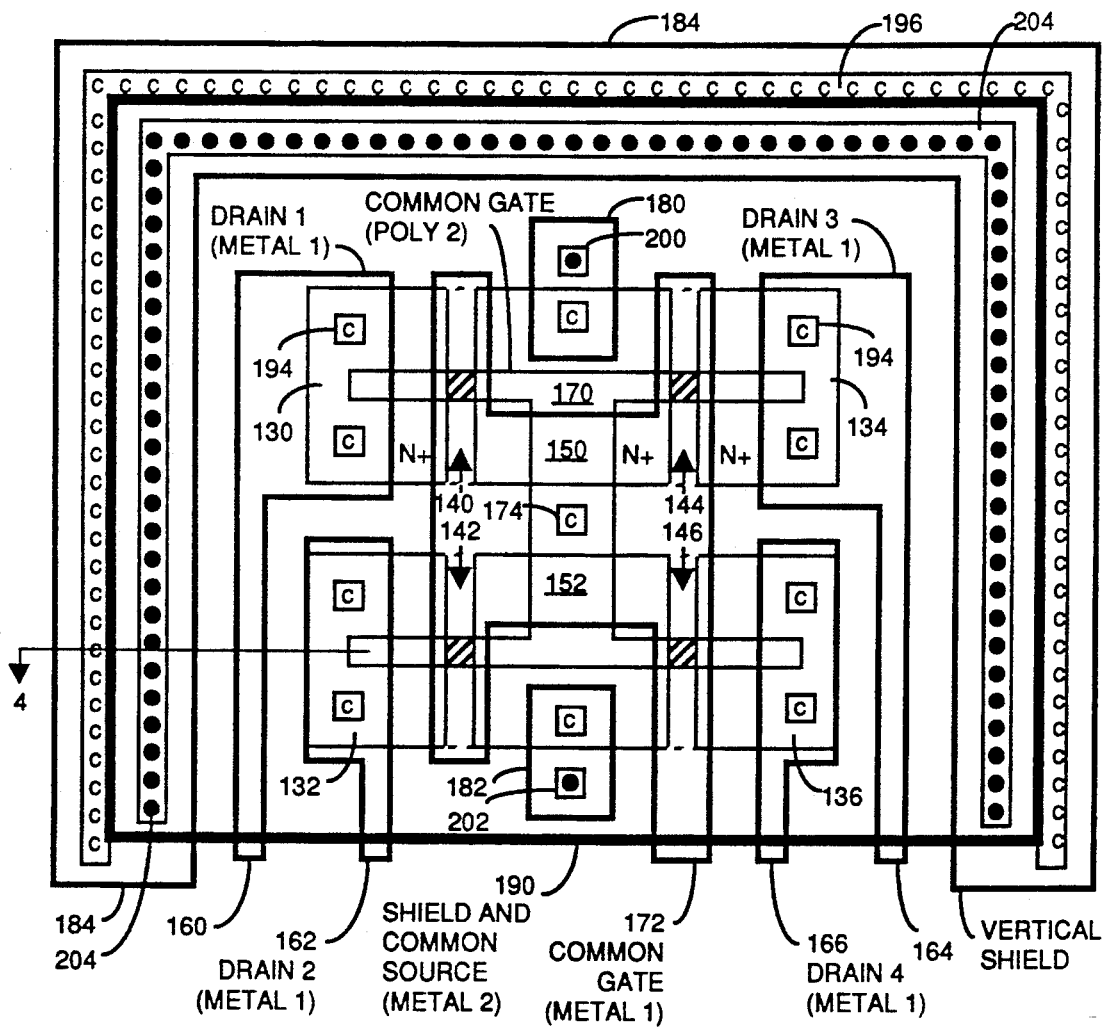
FIG. 2 shows the layout of a set of four shielded EPROM cells in accordance with the present invention.
Figure 3:
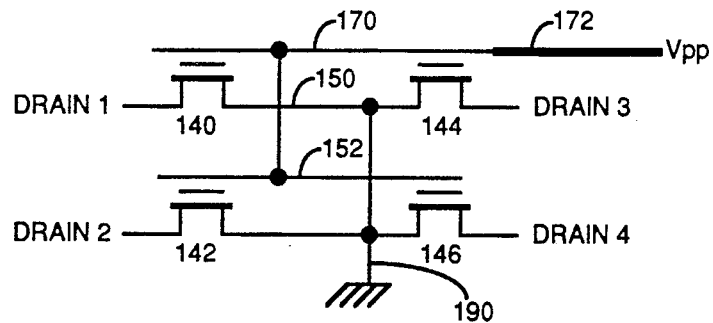
FIG. 3 depicts a circuit diagram of the four cell circuit layout of FIG. 2.

Referring to FIGS. 2 and 3, there is shown a layout of a set of four shielded EPROM cells in accordance with the present invention, and the equivalent electrical circuit. The EPROM device of the present invention is formed using two metal interconnect layers, herein called Metal 1 and Metal 2. In the main EPROM array 100, the use of two metal layers improves the speed at which information stored in the array 100 can be accessed. In the redundancy control circuit 108, the use of two layer metals is useful because one metal layer can be used as a shield against ultraviolet light while the other metal layer is used for EPROM cell device interconnections.

In accordance with the standard terminology used in the semiconductor industry, polycrystalline silicon is herein called "polysilicon". A first layer of polysilicon which is deposited and patterned on the device is called "the first polysilicon layer", or Poly 1, and a second polysilicon layer to be deposited and patterned is called "the second layer of polysilicon", or Poly 2.

For those readers not familiar with semiconductor circuit layouts, it may be helpful to first view FIG. 3 and to read the descriptions of FIGS. 4 and 5A-5E before reading the following description of the complete circuit layout shown in FIG. 2.

In FIG. 2 regions 130, 132, 134 and 136 are N+ diffusion regions that form the drains (Drain 1 through Drain 4) of four distinct transistors 140, 142, 144 and 146. Regions 150 and 152 are N+ diffusion regions that form the common source of these transistors. Each of the four drain regions 130-136 is coupled to a corresponding Metal 1 layer connection 160, 162, 164, 166.

The four crosshatched regions in FIG. 2 are four floating Poly 1 gates for transistors 140, 142, 144 and 146. The Poly 2 control gate 170 for these four transistors has the shape of a capital "H" laying on its side.

The control gate 170 is coupled to a Metal 1 connection 172 by contact 174.

Metal 1 regions 180 and 182 are used to form connections between the Metal 2 layer 190 and source diffusion regions 150 and 152. The Metal 2 layer 190 is coupled to the EPROM devices' common ground node and therefore serves as a ground voltage potential source for the shielded EPROM memory cells 110 (shown in FIGS. 2 and 3 as transistors 140-146).

Metal 1 region 184 is used as a portion of the vertical metal shield on the top, left and right sides of the circuit.

The regions of FIG. 2 marked by the letter "c" (regions 174, 194 and 196) are contacts between Metal 1 connection lines and lower layers. In particular, contact 174 is used to connect a Metal 1 line 172 to the common Poly 2 gate 170. Contacts 194 are used to connect the EPROM drain regions 130-136 to Metal 1 lines 160-166 and also to connect Metal 1 regions 180 and 182 to source regions 150 and 152. Contact 196 connects Metal 1 region 184, which rings three sides of the circuit, to the substrate. Thus contact 196, when filled with metal from the deposition of the Metal 1 layer, forms a portion of a vertical metal shield 210 around the four transistors 140-146 Vias 200-204, which are shown in FIGS. 2 and 5E as regions marked with black dots, are connections between the Metal 2 shield 190 and Metal 1 regions.

Figure 4:
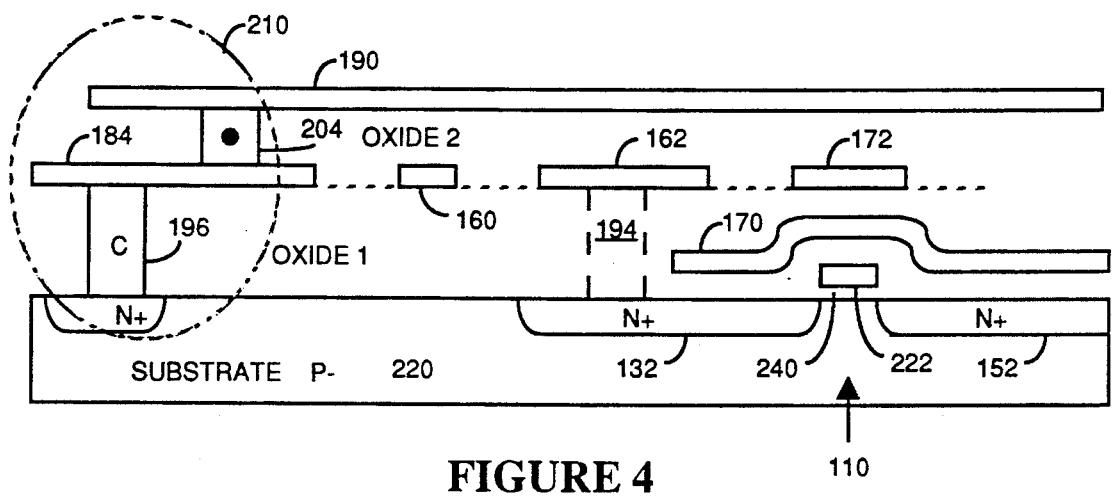
FIG. 4 depicts a partial cross sectional view of a semiconductor wafer incorporating the preferred embodiment.

FIG. 4 depicts a partial cross sectional view of a semiconductor wafer incorporating the preferred embodiment. The device is formed in a P— silicon substrate 220. As shown, each EPROM cell 110 has a floating gate 222 formed from a first polysilicon layer (Poly 1), and a control gate 170 formed from a second polysilicon layer.

FIG. 4 clearly shows the Metal 2 shield 190 overlaying the non-erasable EPROM cell 110. Also shown is the vertical metal wall 210 formed by Metal 1 region 184, contact 196 and via 204. This wall 210 shields three sides of the circuit from any light which might otherwise reflect off the substrate toward the floating gate 222. In other words, while the EPROM cells in the main array 100 are being erased by exposing the entire device to ultraviolet light, the top Metal 2 shield 190 and the partial vertical shield 210 prevent that ultraviolet light from reaching the shielded cells 110, thereby preserving the redundancy control information stored in those cells.

PROCESSING METHODOLOGY

Referring to FIGS. 5A-5E, the shielded EPROM cells 140-146 shown in FIGS. 2-4 are manufactured as follows. The starting material is a wafer of P— type monocrystalline silicon. The substrate 220 shown in the Figures comprises a small portion of a wafer. The steps for initially preparing the wafer and for forming field oxide are well known to those skilled in the art and are not therefore described here.

Figure 5A:
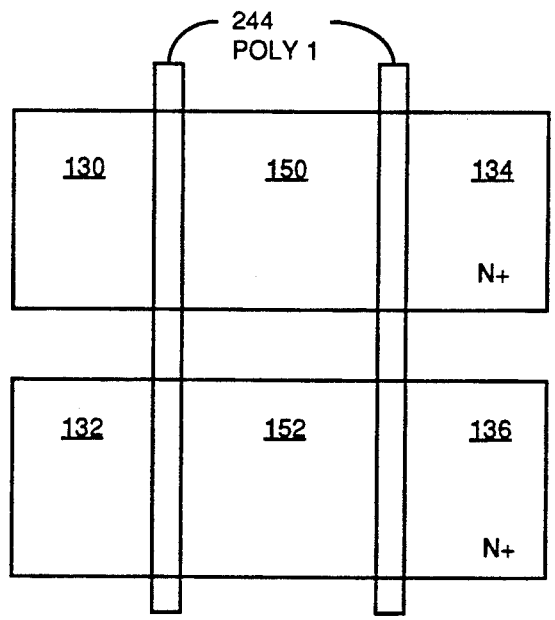
FIGS. 5A-5E depict the steps of the process for forming a circuit having the circuit layout shown in FIG. 2.
Figure 5B:
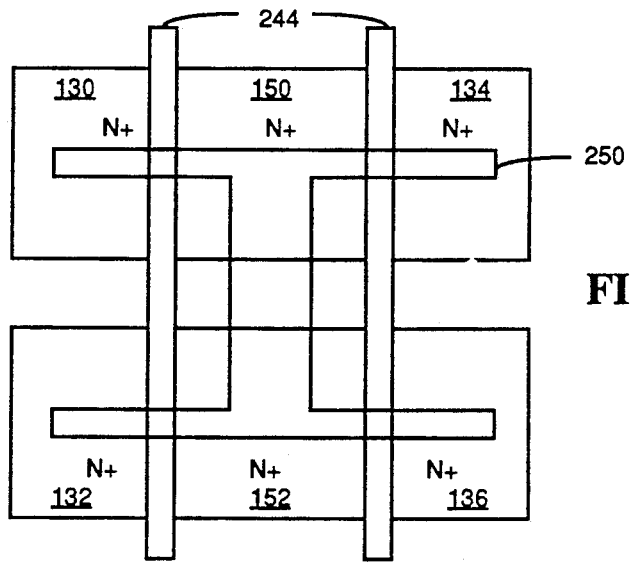
Figure 5C:
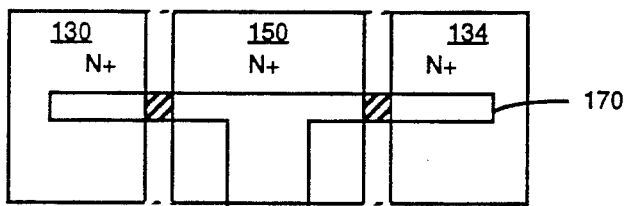
Figure 5D:
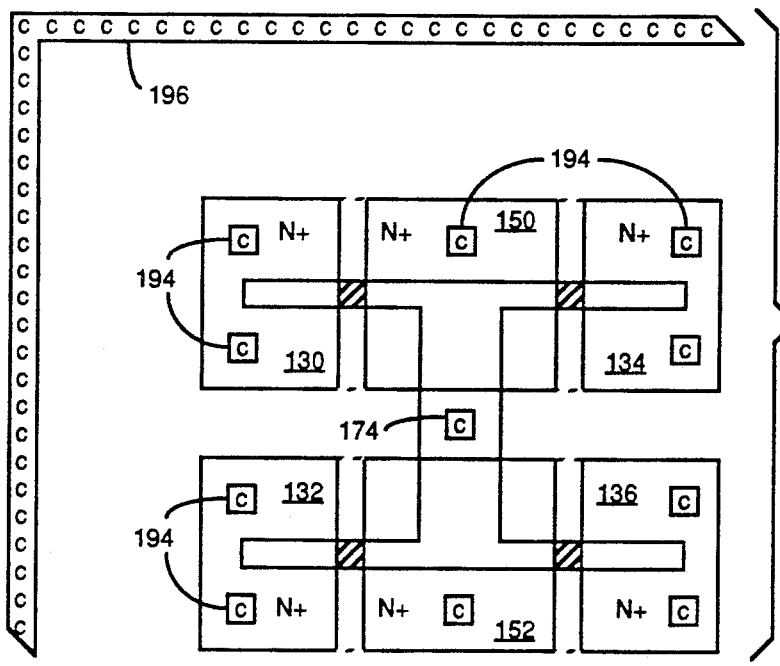
Figure 5E:
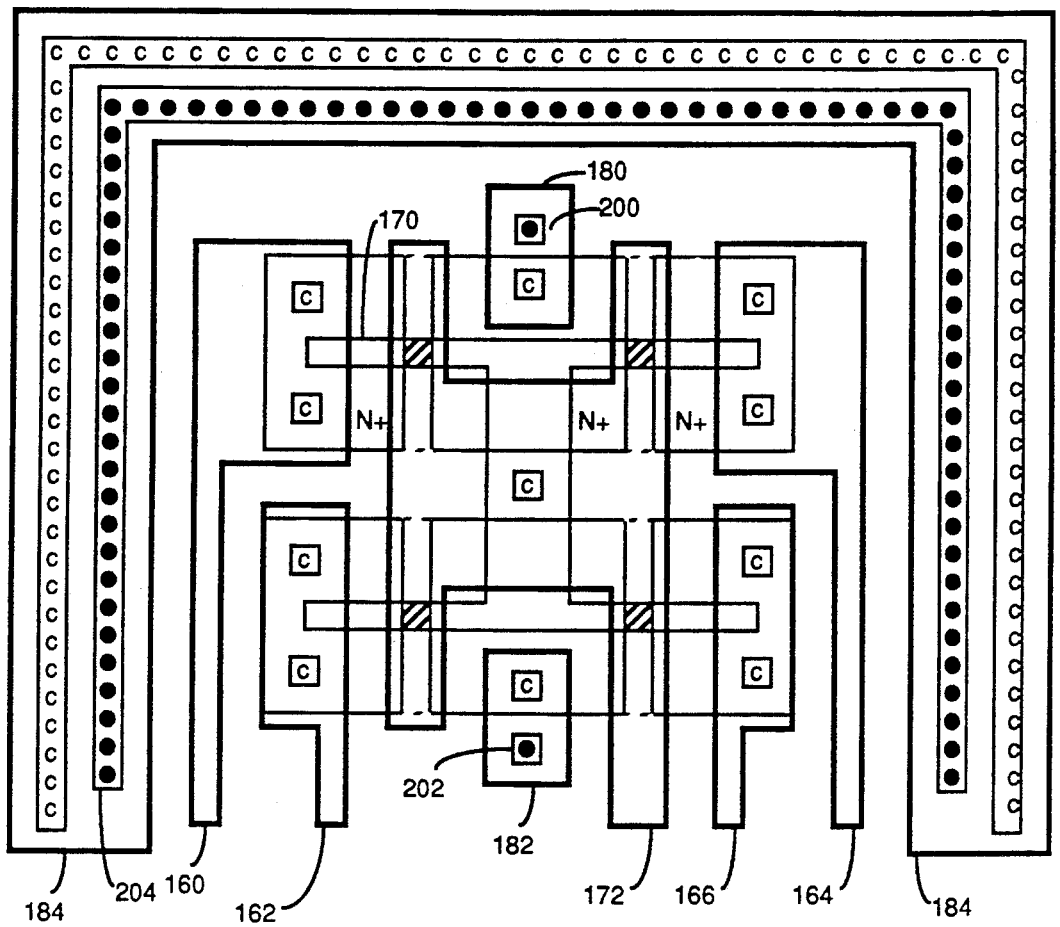

Referring to FIG. 5A, the manufacturing process begins with the formation of floating gates and drain/source diffusion regions. The steps for forming the Poly 1 gates are, in sequence:

1) form a thin gate oxide 240 of approximately 200 to 300 angstroms;
2) deposit an overlying Poly 1 floating gate layer, and subject it to phosphorus deposition to render it highly conductive;
3) form an insulator layer 242 over the Poly 1 layer, the insulator layer is preferably a sandwich of silicon oxide, silicon nitride and silicon oxide; and 4) pattern and etch Poly 1 columns using conventional photoresist masking and etching to form Poly 1 "columns" 244 as shown in FIG. 5A.

These processing steps are prior art processing steps well known to those skilled in the art and are therefore not further described here.

The next step is to form N+diffusion regions 130-136 and 150-152. In the preferred embodiment, diffusion regions are formed using an N+ion (i.e., arsenic). This implant is self aligned with the Poly 1 columns 244 (which will later become floating gate 222) and produces a steep PN junction between the source/drain diffusion regions and the channel under the Poly 1 gate.

In step 5B, Poly 2 is deposited and doped to make it conductive. Then, in step 5C the Poly 2 layer is patterned and etched using conventional photoresist masking (see Poly 2 mask 250) and etching to form Poly 2 common gate 170. This step etches away the Poly 1 regions not underlying Poly 2. It may be noted that in the main EPROM cell array Poly 2 is typically used to form word lines, while Poly 1 is used to form floating gates 222.

In step 5D, an oxide or other insulator layer is formed on top of the entire circuit, and then contact holes 174, 194 and 196 are etched through the insulator layer. As described above, contact 174 will be used to connect a Metal 1 line to the common Poly 2 gate, contacts 194 will be used to connect the drain lines to Metal 1 lines and also to connect other Metal 1 regions to source regions 150 and 152, and contact 196 will be used to connect a Metal 1 region which rings three sides of the circuit to the substrate.

In step 5E, a Metal 1 layer is deposited and then patterned and etched using conventional photoresist masking and etching to form Metal 1 connections 160-166, 172 and 180-184. Then an oxide or other insulator layer is formed on top of the Metal 1 layer, and vias 200, 202 and 204 are etched through that insulator layer. The vias will be used to form connections between the Metal 1 layer and the Metal 2 layer.

Finally, the Metal 2 layer is deposited and then patterned and etched using conventional photoresist masking and etching to form the circuit pattern shown in FIG. 2.

In summary, the shielded EPROM cells are protected from exposure to light by a metal layer above the cells, and by a partial metal vertical wall. The area occupied by four non-erasable EPROM cells using the present invention is between 400 square microns and 900 square microns, using 1 micron minimum device sizes, depending on the methodology used to form the vertical metal walls and the methodology used to connect the drains and common gate lines. When more than four cells are formed under a single Metal 2 shield, the average area per shielded EPROM cell will decrease, making the density of shielded EPROM cells even better. In any case, it is believed that the shielded EPROM cells of the present invention occupy less than ten percent of the space required by prior art shielded EPROM cells.

Figure 6:
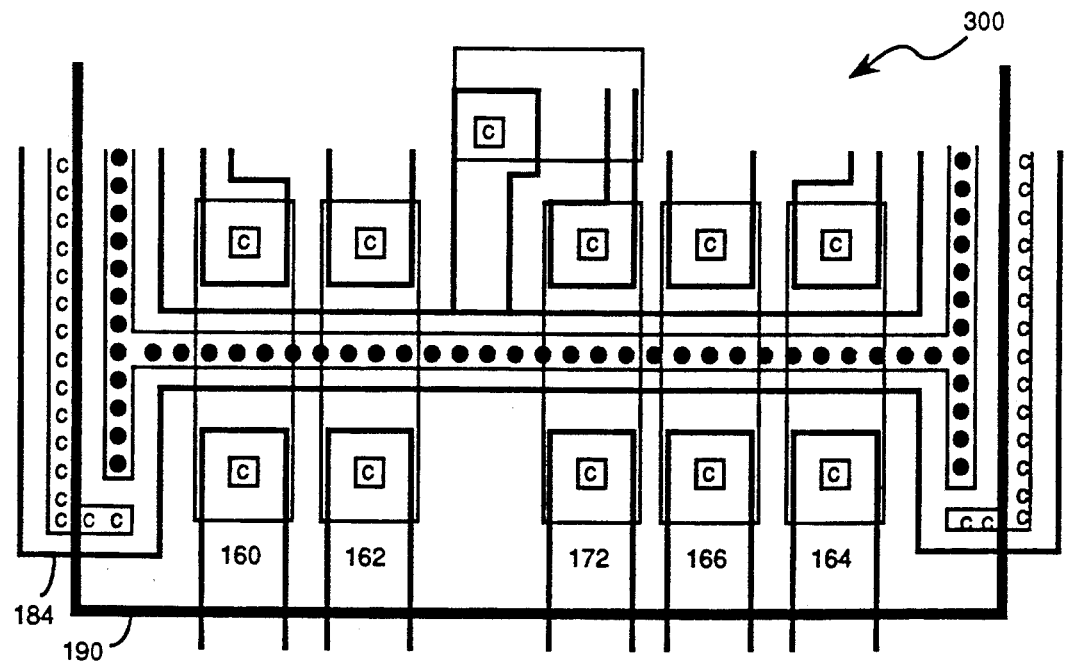
FIG. 6 shows an end cap for the circuit shown in FIG. 2 which further protects the memory cells therein from exposure to radiation.

FIG. 6 shows one example of an "end cap" 300 which makes the vertical shield more complete, using short diffusion runs to connect the drain lines and common gate to metal lines outside the protected area. The metal 2 and vias form a partial vertical shield, and the metal 1 and contacts connections under the shield "complete" the vertical shield, except for a few holes.

Figure 7:
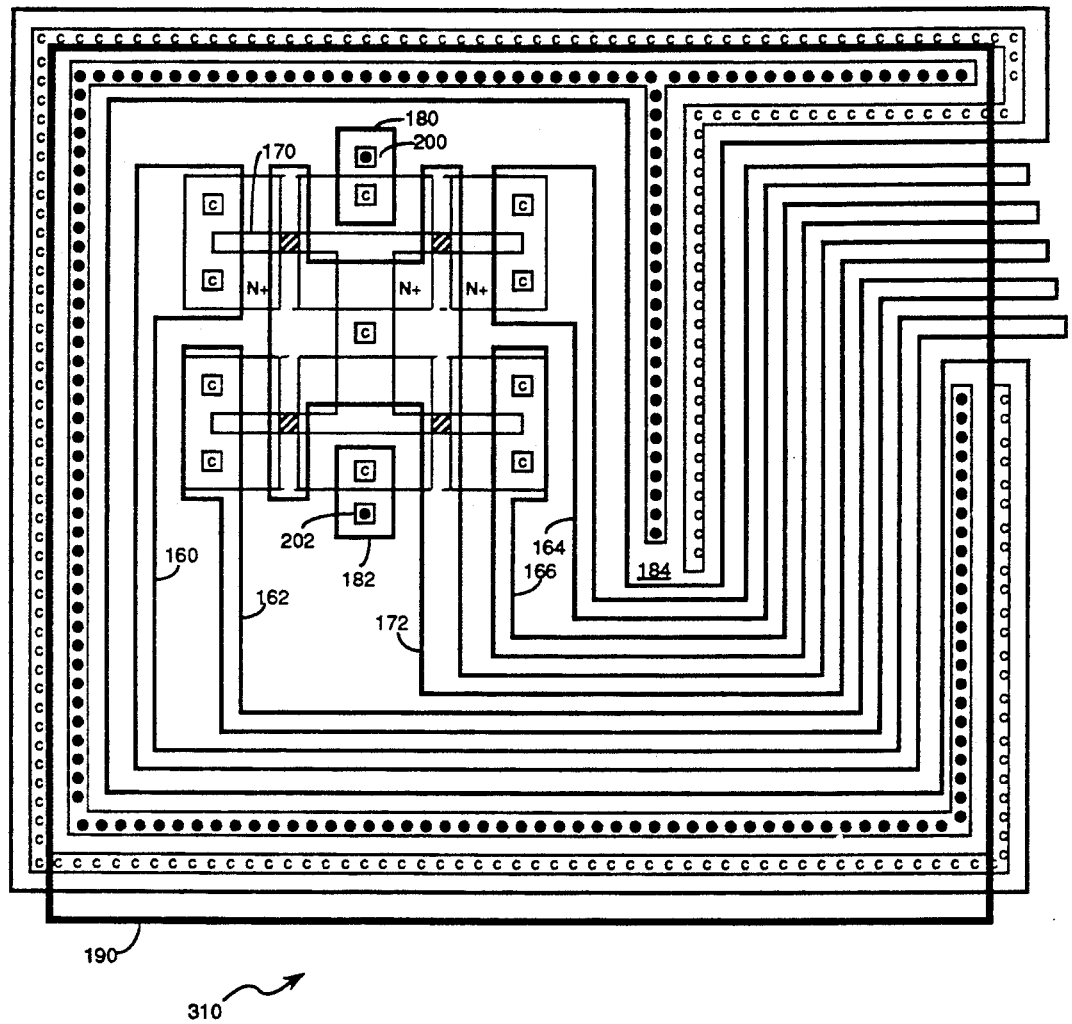
FIG. 7 shows a second type of end cap for the circuit shown in FIG. 2 which protects the memory cells therein from exposure to radiation.

FIG. 7 shows another end cap 310 which uses a short section of serpentine metal connectors surrounded by vertical metal walls with two "bottle neck" sections to make vertical shielding of the memory cells more complete.

ALTERNATE EMBODIMENTS

While the present invention has been described with reference to a few specific embodiments, the description is illustrative of the invention and is not to be construed as limiting the invention Various modifications may occur to those skilled in the art without departing from the true spirit and scope of the invention as defined by the appended claims.

What is claimed is:

1. In a semiconductor electrically programmable read only memory (EPROM) which contains an array of memory cells which store data that is erased when the EPROM is exposed to radiation, non-erasable memory cells comprising:
   a plurality of EPROM cells, each said EPROM cell having a source region and a drain region;
   a set of metal connection lines, formed from a first metal layer, including a distinct connection line coupled to said drain region of each said EPROM cell;
   a metal shield, formed from a second metal layer, overlying said EPROM cells and said metal connection lines; and
   vertical metal walls coupled to said metal shield which at least partially block radiation from entry under said metal shield.

2. The non-erasable memory cells set forth in claim 1, said metal shield being connected to said source regions of said EPROM cells so as to provide a common ground voltage potential to said EPROM cells.

3. The non-erasable memory cells set forth in claim 1, said plurality of EPROM cells having a common polysilicon control gate coupled to an additional metal connection line formed from said first metal layer.

4. In a semiconductor electrically programmable read only memory (EPROM) which is fabricated on a substrate and which contains an array of memory cells that store data that is erased when the EPROM is exposed to radiation, redundant memory circuitry comprising:
   redundant memory cells to be used in place of defective memory cells;
   a programmable redundancy control circuit which causes said redundant memory cells to be used in place of said defective memory cells, said programmable redundancy control circuit including a plurality of EPROM cells, each said EPROM cell having a source region and a drain region;
   a set of metal connection lines, formed from a first metal layer, including a distinct connection line coupled to said drain region of each said EPROM cell;
   a metal shield, formed from a second metal layer, overlying said EPROM cells and said metal connection lines; and
   vertical metal walls coupled to said metal shield which at least partially block radiation from entry under said metal shield;
   whereby said EPROM cells in said programmable redundancy control circuit can be permanently programmed so that said redundant memory cells are always used in place of said defective memory cells.

5. The redundant memory circuitry set forth in claim 4, said metal shield being connected to said source regions of said EPROM cells so as to provide a common ground voltage potential to said EPROM cells.

6. The redundant memory circuit set forth in claim 4, said plurality of EPROM cells having a common polysilicon control gate coupled to an additional metal connection line formed from said first metal layer.

* * * * *